Figure 3:
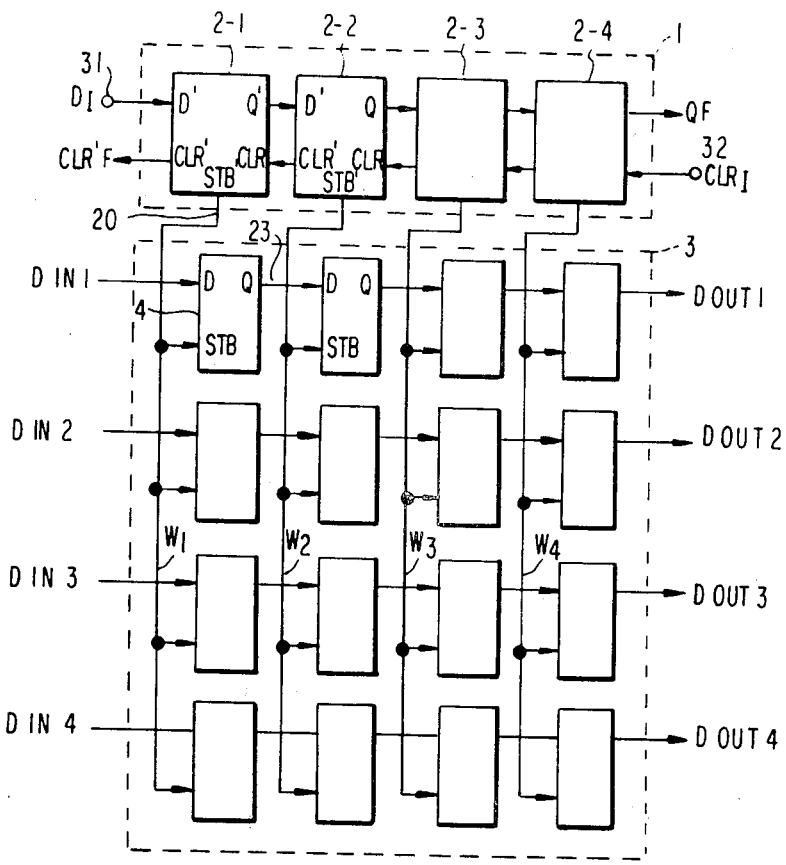

United States Patent [19]
Ohtsuka

[11] Patent Number: 4,459,681
[45] Date of Patent: Jul. 10, 1984

[54] FIFO MEMORY DEVICE

[75] Inventor: Toshinori Ohtsuka, Ashikaga, Japan

[73] Assignee: Nippon Electric Co., Ltd., Tokyo, Japan

[21] Appl. No.: 364,720

[22] Filed: Apr. 2, 1982
(Under 37 CFR 1.47)

[30] Foreign Application Priority Data

Apr. 2, 1981 [JP] Japan .................................. 56-49756

[51] Int. Cl.$^3$ .............................................. G11C 7/00
[52] U.S. Cl. ..................................... 365/78; 365/221
[58] Field of Search ........................... 365/78, 221, 189

[56] References Cited
U.S. PATENT DOCUMENTS 3,893,088 7/1975 Bell ....................................... 365/78
4,151,609 4/1979 Moss ...................................... 365/78

Primary Examiner—James W. Moffitt
Attorney, Agent, or Firm—Sughrue, Mion, Zinn, Macpeak, and Seas

[57] ABSTRACT

A first-in-first-out memory device which is operable at a high-speed is disclosed. The memory device comprises a plural stages of memory units and a plural stages of control unit, each of the control units including a circuit for indicating whether its stage holds effective data or not, a circuit for receiving a signal of the indicating means of the previous stage, and a circuit generating a write signal when the memory cell holds no effective data and the previous stage hold effective data, in which the write signal is used to remove data stored in the previous memory cell to the corresponding stage memory cell.

7 Claims, 9 Drawing Figures

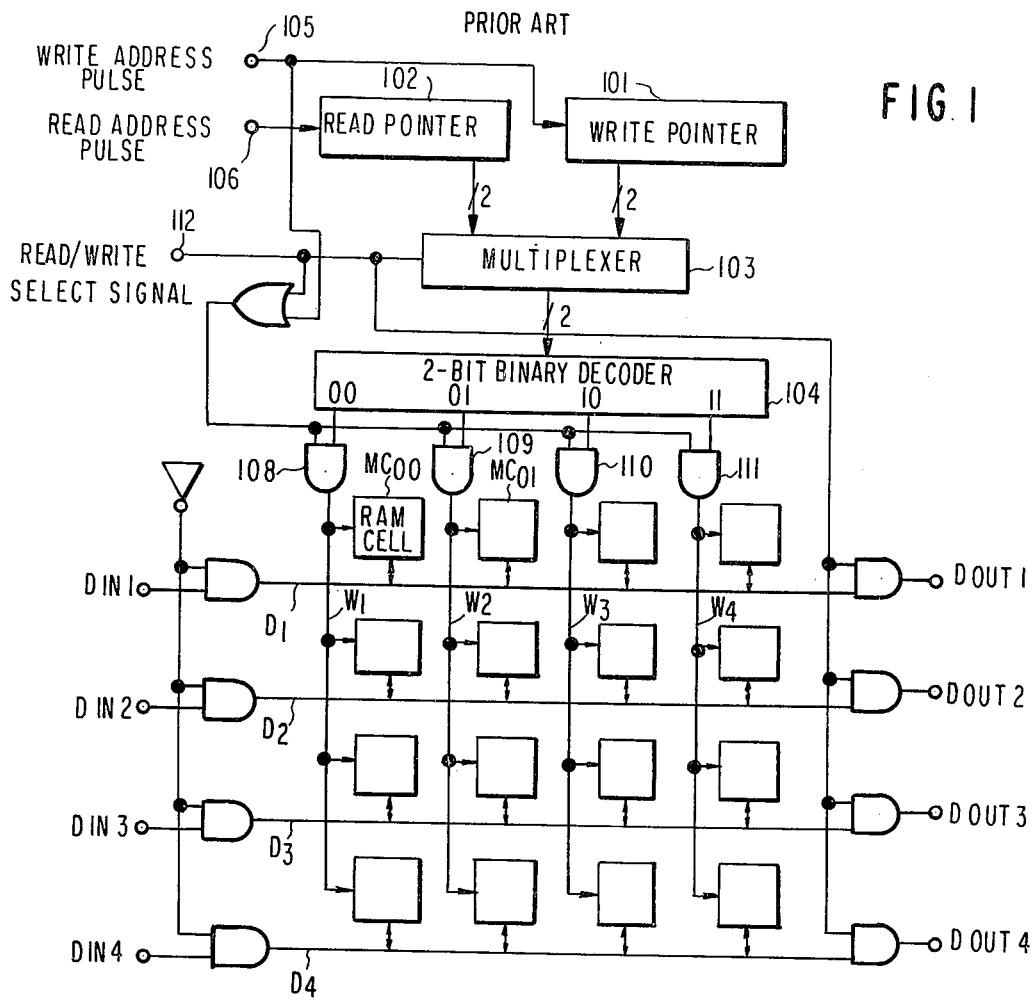
FIG. 1 PRIOR ART
FIG. 2 PRIOR ART
READ WRITE SELECT SIGNAL 
DIN 1
WRITE POINTER UPPER BIT 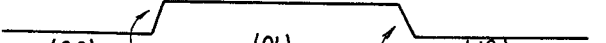
WRITE POINTER LOWER BIT
WRITE ADDRESS PULSE 
READ POINTER UPPER BIT 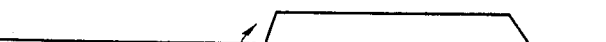
READ POINTER LOWER BIT
READ ADDRESS PULSE 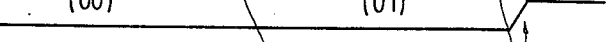
D OUT 1 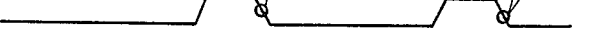

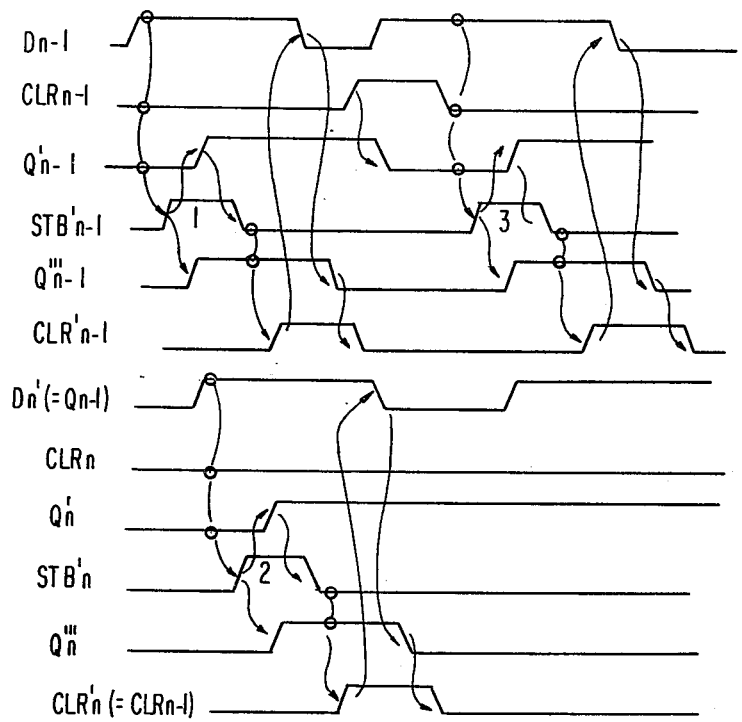
FIG. 7
FIG. 4
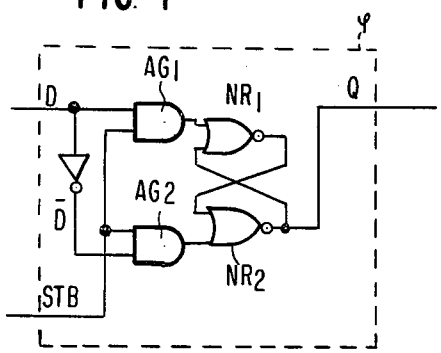
FIG. 8
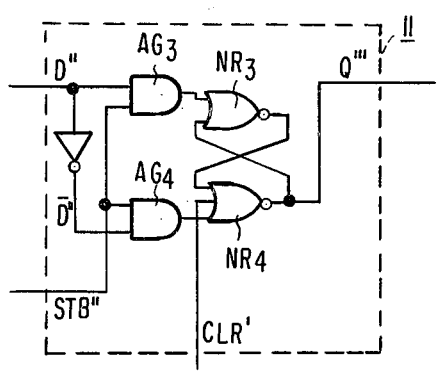
FIG. 9
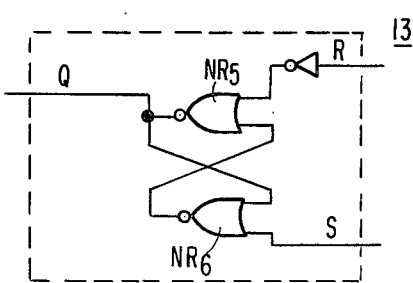

FIFO MEMORY DEVICE

The present invention relates to a memory device, and more particularly to a first-in-first-out (hereinafter abbreviated as FIFO) memory device.

A FIFO memory device is such that a read output is derived in the order of input thereof, and it is classified into one kind of serial access memories. As the serial access memory, a shift register is a common one. In a shift register, input data is first stored at the bit position of the input end of the shift register, and after having been subjected to shift operations, the data are derived from its output end. Whereas, in a FIFO memory device, input data is immediately shifted from the input end of the device to the bit position at the output end and are thus stored at the bit positions of the output end. Next subsequent input data is stored at the bit position located next to the aforementioned bit position toward the input end. Consequently, whatsoever data series may have been input, the data series is held at the output end, and hence they can be derived immediately. Alternatively, it has been also practiced that a conventional RAM is employed and virtually a FIFO operation is carried out by controlling addresses for write and read without effecting physical shift of the data. Accordingly, a FIFO memory device has a characteristic merit that read can be achieved at a high speed. Such FIFO memory devices can be used for the purpose of interfacing in that upon inputting a data series generated at a low speed to a high speed data processor, the data series is once stored in the FIFO memory device and subsequently the stored data series is read out at a speed matched with the processor to be processed at a high speed. In addition, they are also used for the purpose of converting asynchronously generated signals into a synchronized data series.

Heretofore, in a FIFO memory device, a random access memory (RAM) was used for storing data, and virtually first-in-first-out (FIFO) operations were carried out by providing two address registers and thereby controlling the address itself. However, such type of address control circuits were difficult to achieve high-speed operations because generally they necessitated an adder or a subtractor and upon every read operation addition or subtraction had to be effected for the address. Furthermore the amount of circuit for the above-described address control was large, and hence this address control circuit was not suitable for a FIFO memory device.

It is therefore one object of the present invention to provide a FIFO memory device which has a simple circuit construction.

It is another object of the present invention to provide a FIFO memory device which can achieve a high speed operation.

According to one aspect of the present invention, there is provided a memory device, comprising a plural stages of memory cells arranged in series in which data is inputted in a first stage memory cell and outputted from a final stage memory cell, a plural stages of control units provided in correspondence with the respective stages of the memory cells, each of the control units including latch means which takes a first state when effective data is held in the associated memory cell and takes a second state when effective data is not held therein, means for receiving an output signal of the latch means belonging to the previous stage, means for generating a control signal when the latch means takes the second state and the latch means of the previous stage takes the first state, and means for supplying the associated memory cell with the control signal thereby to allow the corresponding memory cell incorporate date from the previous stage memory cell.

According to another aspect of the present invention, there is provided a memory device comprising a plural stages of memory units, each of the memory units having a data input terminal receiving a data signal from the preceding stage, a data output terminal and a control terminal receiving a control signal for controlling a write operation thereof, and a plural stages of control units provided for the respective the stages of the memory units, each of the control units operatively generating the control signal for the memory unit in the corresponding stage and including first means for generating a set signal when the memory unit in the corresponding stage holds effective data, second means for receiving a clear signal from the subsequent stage, third means responsive to the clear signal for disenabling the first means, fourth means for receiving the set signal from the preceding stage of the control unit, fifth means for generating the control signal when the set signal is not generated in the first means and the clear signal from the subsequent stage of the control unit is not present while the set signal from the preceding stage of the control unit is present, sixth means responsive to the control signal for enabling the first means so as to generate the set signal, and seventh means for generating the clear signal for the preceding stage in response to disappearance of the control signal.

According to one feature of the present invention, there is provided a novel first-in-first-out (FIFO) memory device comprising a plurality of stages, each consisting of a one-bit latch having an input for a write signal that is common with a data memory section and an input for a clear signal, a first gate circuit for detecting that the input value of the latch is "1" and its output value is "0" and that said clear signal is not present to use the detection signal as a write signal to the data memory section in the same stage, a flip-flop adapted to be set by said write signal and reset by the input value "0" of said latch, and a second gate circuit for detecting that said flip-flop is set and said write signal is not present to use the detection signal as said clear signal for said latch, the output of said latch in each stage being connected to an input of said latch in the next succeeding stage.

According to another feature of the present invention, there is provided a buffer control circuit comprising a n-th stage circuit including a latch, a first gate for deriving an output to be used for transmitting a write signal to a corresponding memory section, a flip-flop and a second gate; and (n−1)-th and (n+1)-th stage circuits respectively having a similar construction to said n-th stage circuit and arrayed before and behind said n-th stage circuit; in said n-th stage circuit, said latch being applied with an output of the latch in said (n−1)-th stage, an output of said first gate and an output of the second gate in said (n+1)-th stage to its inputs, said first gate being applied with an output of said latch, an output of the latch in said (n−1)-th stage and an output of the second gate in said (n+1)-th stage to its inputs, said flip-flop being applied with an output of the latch is said (n−1)-th stage and an output of said first gate to its inputs, and said second gate being applied with an output of said first gate and an output of said flip-flop to its inputs.

According to the present invention, a high speed operation of a FIFO memory device can be realized because address control is achieved without carrying out addition nor subtraction.

Figure 5:
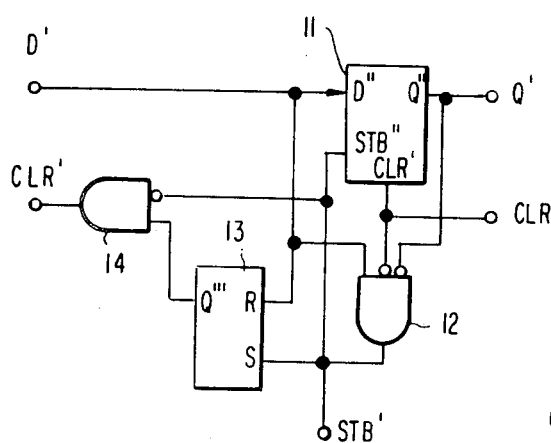
Figure 6:
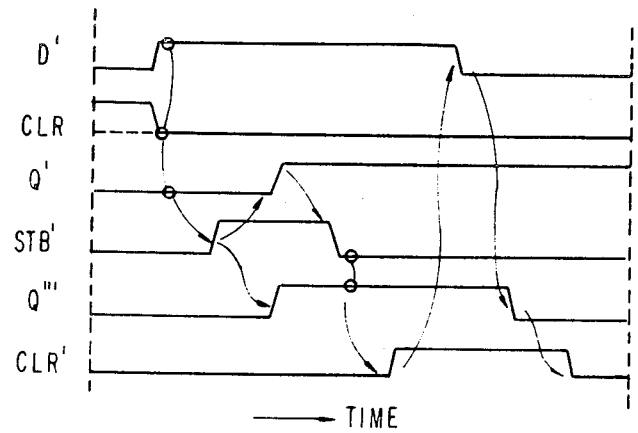

The above-mentioned and other objects, features and advantages of the present invention will become more apparent by reference to the following description of one preferred embodiment of the invention taken in conjunction with the accompanying drawings, wherein:

FIG. 1 is a block diagram showing a FIFO memory device in the prior art,

FIG. 2 is a waveform diagram to be referred for explaining the operation of the memory device shown in FIG. 1, FIG. 3 is a block diagram showing a FIFO buffer circuit employing a control circuit according to one preferred embodiment of the present invention, FIG. 4 shows one example of a construction of a circuit block 4 in FIG. 3, FIG. 5 is a circuit diagram showing a unit circuit construction forming each stage of a control section in the circuit shown in FIG. 3, FIG. 6 is a waveform diagram to be referred to for explaining the operation of the circuit shown in FIG. 3 and the circuitry shown in FIG. 5, FIG. 7 is a waveform diagram to be referred to for explaining a data shift operation over a plurality of stages of the circuit shown in FIG. 3, FIG. 8 is a circuit diagram showing one example of a construction of a flip-flop 11 in FIG. 5, and FIG. 9 is a circuit diagram showing one example of a construction of a flip-flop 13 in FIG. 5.

Before entering description of a preferred embodiment of the present invention, description will be made on a FIFO memory device in the prior art with reference to FIGS. 1 and 2. In these figures, illustration is made with respect to a 4×4 bit construction of a FIFO memory device.

In FIG. 1, at the intersections between four address lines $W_1$ to $W_4$ and four data lines $D_1$ to $D_4$ are disposed RAM cells MC. These RAM cells MC are selected by applying four outputs of a 2-bit decoder 104 which are coupled to the address lines $W_1$ to $W_4$ via control gates 108 to 111, respectively.

A write pointer 101 has a 2-bit construction and designates a write address on the basis of write address pulses applied to a terminal 105. A read pointer 102 also has a 2-bit construction and designates a read address on the basis of read address pulses applied to a terminal 106. A multiplexer 103 responds to a read/write select signal applied to a terminal 112 so as to transmit the address output of the write pointer 101 to a decoder 104 when the read/write select signal is at a write level (low level). Whereas, when the read/write select signal is at a read level (high level), it transmits the address output of the read pointer 102 to the decoder 104.

In the illustrated circuit construction, four data lines $D_1$ to $D_4$ are provided and the memory cells associated with all the data lines are simultaneously addressed. Therefore, in the following operations relating to one data line $D_1$ will be explained with reference to FIG. 2.

A read/write select signal is used for determining either read timing or write timing for the RAM cells, and when this signal is at logic "1" it represents a read cycle, while when this signal is at logic "0" it represents a write signal. The 2-bit read pointer 102 and the 2-bit write pointer 101 are initially preset at "00". After data arrive at a data input terminal $D_{in1}$, a write address pulse become active to increment the content of the write pointer 101. The read pointer 102 is incremented by a read address pulse which is output as a result of comparison between the content of the write pointer 101 and the content of the read pointer 102. Accordingly, data "A" which have at first arrived at the data input terminal $D_{in1}$ are written in the RAM cell $MC_{00}$ designated by the contents "00" of the write pointer 101, and data "B" which come to the data input terminal $D_{in1}$ next are written in the RAM cell $MC_{01}$ designated by the contents "01" of the write pointer 101.

On the other hand, in a read cycle, the data "A" is read out of the RAM cell $MC_{00}$ designated by the content "00" of the read pointer 102, and next the data "B" are read out of the RAM cell $MC_{01}$ designated by the contents "01" of the read pointer 102. In this way, FIFO control is achieved successively.

As described above, in the heretofore known circuit, upon each write or read cycle the operation of carrying out addition in the pointer was necessitated, and this was a great obstacle against realization of a high speed operation.

Now the present invention will be described in greater detail with reference to the accompanying drawings. A FIFO buffer circuit employing a control circuit according to one preferred embodiment of the present invention is illustrated in FIG. 3. This circuit is a 4-stage FIFO buffer having a data bit width of 4. In FIG. 3, data memory section 3 includes 16 one-bit memory units 4 which are divided into four 4-bit stage arrangements located between a data input terminal $D_{in1}$ and a data output terminal $D_{out1}$ to between a data input terminal $D_{in4}$ and a data output terminal $D_{out4}$. Each of memory units 4 has a write strobe terminal STB connected to associated one of address lines $W_1$ to $W_4$ and responds to a write strobe signal applied to its write strobe terminal STB to store data applied to its data terminal D. A read signal is derived from an output terminal Q of the memory unit 4 and subjected to the subsequent bit stage of memory unit 4 through a data line 23. Write and read operations of four 4-bit stages of memory units are performed in parallel by use of strobe signals applied through address lines $W_1$ to $W_4$.

A detailed example of the memory units 4 is shown in FIG. 4. As shown in FIG. 4, the memory unit 4 includes a pair of NOR gates $NR_1$ and $NR_2$ whose output terminals and first input terminals so as to form a known flip-flop circuit and a pair of AND gates $AG_1$ and $AG_2$ for operatively transferring a signal ($\overline{D}$) and its complementary signal (D) to second input terminals of the NOR gates $NR_1$ in response to the strobe signal (STB). A control section/controls the operations of the memory section 3. The control section/includes four control units 2-1 to 2-4 connected in cascade which control the address lines $W_1$ to $W_4$ respectively. Each of the control units 2-1 to 2-4 judges whether the corresponding stage is ready to be subjected to write operation or not and responds to a write command signal applied to its terminal D' to enable the corresponding address line through its terminal STB when the corresponding stage is ready to be subjected to the write operation. The control units 2-1 to 2-4 include a D-type flip-flop as described in later. To the address line $W_1$ is output a write signal STB generated in the circuit 2-1, and this signal STB is applied to STB-terminals of the four first stage of one-bit memory units 4 in common in the corresponding stage of the memory section 3, hence values at the input terminals $D_{in1}$ to $D_{in4}$ are taken in the memory units 4 in the first stage and thereby they are output at their Q-terminals. To a terminal 31 is applied an external write command signal $D_I$, and from the circuit in the last stage is generated a write completion signal $Q_F$. On the other hand, upon read or clear, a signal $CLR_I$ is applied to a terminal 32. When the read or clear has been finished, a finish signal $CLR_F$ is produced. In each of the control unit circuit 2, a signal at the terminal Q' represents whether the corresponding stage stores an effective datar or not, while a signal at the terminal CLR represent that the corresponding stage is subjected to read operation or clear operation. A write command signal to the corresponding stage is applied to the terminal D'. Thus, the control unit circuit 2 generates a strobe signal STB at the terminal STB' when the effective stored data and the clear signal at the terminal CLR are not present and the write command signal is present at the terminal D' in the corresponding stage.

FIG. 5 shows a detailed circuit construction of each of the control unit circuits (2-1 to 2-4) in FIG. 3. This unit circuit 2 includes a D-type flip-flop 11. This flip-flop 11 is a one-bit latch for storing whether or not effective data are present in the corresponding stage of the data memory section 4 (the value in the case of the effective data being present is chosen to be "1"), and it is provided with a data input D", a data strobe input STB", a clear input CLR' from the subsequent stage and a data output Q". One example of the circuit construction of the flip-flop 11 is illustrated in FIG. 8. In FIG. 8, two NOR gates $NR_3$ and $NR_4$ form a known flip-flop circuit in which one input terminal of the NOR gate $NR_4$ is drawn out as the terminal CLR'. A signal (D") and its complementary signal ($\overline{D}''$) are transmitted to the input terminals of the gates $NR_3$ and $NR_4$ through AND gates $AG_3$ and $AG_4$ in response to a signal at the terminal STB". In addition, the unit circuit 2 includes a first gate circuit 12, a second flip-flop 13 and a second gate circuit 14. The first gate circuit 12 generates a detection signal when it detects that the output Q" of the one-bit latch in the preceding stage is "0", the input D' from the one-bit latch in the preceding stage is "1" and the clear input CLR' to the D-type flip-flop 11 is "0". A second flip-flop 13 is set by the above-mentioned detection signal of the first gate circuit 12 which is applied to its set input S, and is reset by the "0" signal at its inverted reset input R through the input D' from the one-bit latch in the preceding stage which is applied to the input D" of the one-bit latch 11. One example of the circuit construction of this flip-flop 13 is fomed by a pair of NOR gates $NR_5$ and $NR_6$ whose output terminals and one input terminals are cross-coupled as illustrated in FIG. 9. The second circuit 14 generates a clear signal CLR' for the one-bit latch in the preceding stage when it detects that the output Q''' of the flip-flop 13 is "1" and that the first gate circuit 12 is not generating the above-mentioned detection signal. Here, marks of small circles at the inputs of the circuits 12, 13 and 14 imply that the signal is inverted there.

FIG. 6 illustrates waveforms of the signals appearing at the respective terminals in FIG. 5 for a unit function with their time axes aligned with each other. The flip-flops and gates 11 to 14 in FIG. 5 would operate in sequence following the arrows indicated in FIG. 6. In FIG. 6, when the signal CLR from the subsequent stage is turned from "1" to "0" level after setting the output Q' to "0" by its "1" level and then the signal D' is turned to "1", the output STB' of the gate 12 becomes "1". Then "1" level of the signal STB' allows the latch 11 to take in the level D' therein so that the output Q' changes from "0" to "1". This means that data is set in the corresponding stage. Simultaneously, the latch 13 is set by the signal STB' to make the output Q''' at "1". While, since the output Q' is changed to "1", the output of the gate 12 changes from "1" to "0". Namely, the signal STB' changes from "1" to "0". Then, the signal STB' of "0" makes the output of the gate 14 at "1" with the signal Q''' of "1". Thus, the clear signal CLR' to the preceding stage is generated. Then, in the preceding stage, (not shown) the output Q' of the preceding stage, i.e. the signal D' of the corresponding stage changes from "1" to "0" and the latch 13 is reset to desappear the clear signal CLR'.

Accordingly, each stage 2 of the control unit circuit according to the illustrated embodiment of the present invention operates in the following manner. With reference to FIGS. 5 and 6, there is provided a one-bit latch 11 having a write signal (STB') common to the data memory section 3 applied as a strobe input and having a clear input CLR applied thereto, which stores whether the data memory section 3 holds effective data or not. When it is effective, the content of the latch is made "1", whereas when it is ineffective the content of the latch is made "0". The input D" of this latch 11 is connected to an output of a similar latch in the preceding stage through D'. When the output Q" of the latch 11 is "0", that is, the corresponding stage in the data memory section is vacant without storing effective data, and a clear signal is not present at the clear input CLR of the latch 11, that is, the latch is in an inputtable conditions, if the data input D' of the latch 11 becomes "1", that is, if effective data are held in the preceding stage of the data memory section, then a strobe signal STB' generated by the first gate circuit 12 adapted to detect the aforementioned condition is applied to the strobe input of this latch 11 and write signal inputs of the memory units 4 in the stage of the data memory section 3 corresponding to this buffer stage 2, so that the effective data in the preceding stage are set in the corresponding stage of the data memory section 3 and also "1" is set in the latch 11 to inform the next succeeding stage that effective data to be delivered have been prepared. Furthermore, the fact that the transfer of effective data from the preceding stage has been effected, is stored by the flip-flop 13 which is set by the above-mentioned strobe signal STB', a clear signal for the latch in the preceding stage is generated by the second gate circuit 14 which detects that the inverted output Q''' of the flip-flop 13 is "1" and the aforementioned strobe signal STB' has not been generated, and thereby it is notified that the contents of the preceding stage in the data memory section have been read out and used. The "0" output of the latch in the preceding stage is used as a reset signal R for the above-mentioned flip-flop 13, and after the latch in the preceding stage has been cleased by the output CLR' of the above-mentioned second gate circuit 14, the flip-flop 11 is reset to be ready for the next data transfer.

By repeating the operation of a unit function of each stage in the buffer control circuit as described above, the operation of the buffer control circuit over a plurality of stages can be achieved. The timing relation in the case where the operation for the unit function illustrated in FIG. 6 is expanded over a plurality of stages is shown in FIG. 7 as represented by a waveform diagram similar to FIG. 6. In FIG. 7, the suffixes n, n−1 represents the stage numbers.

FIG. 7 shows the case where two blocks of data successively arrive at the (n−1)-th stage but the clear signal from the (n+1)-th stage $CLR'_{n+1}(=CLR_n)$ has not become active, that is, the case where data have been already stored in the (n+1)-th stage. Strobe signal $STB'_{n-1}$ becomes active at time points ① and ③ to latch the two block of data, a strobe signal $STB'_n$ becomes active at a time point ② to latch the data which have initially arrived at the (n−1)-th stage among the block of data. In other words, the state is established wherein the last data are latched in the (n−1)-th stage in response to the strobe signal $STB'_{n-1}$ at the time point ③ and the first data are latched in the n-th stage in response to the strobe signal $STB'_n$ at the time point ②.

Read of data not associated with write operation is carried out in the following manner. Referring now to FIGS. 3, 4 and 5, since the outputs of the memory cells 4 in the last stage (the 4-th stage) of the memory section 3 are held at the output terminals Q of the respective cells, they are read out of the output terminals $D_{out1}$ to $D_{out4}$ of the memory section 3. Read of the memory contents in the cells in the third, second and first stages, respectively, is effected through the process of rewriting the contents of the memory cells 4 in the respective stages successively by the contents of the memory cells 4 in the just preceding stages by applying a signal $CLR_I$ to a terminal 32. More particularly, in response to application of the signal $CLR_I$ to the terminal 32, at first a strobe signal STB is transmitted from a buffer circuit unit 2 in the fourth stage to the memory cell 4 in the fourth stage, hence the contents of the outputs Q of the memory cells 4 in the third stage are written in the memory cells 4 in the fourth stage, and they are read out at the data output terminals $D_{out1}$ to $D_{out4}$. In response to generation of a strobe signal STB in the buffer circuit unit 2 in the fourth stage, a clear signal CLR' is transmitted from this unit 2 to a terminal CLR of the buffer circuit unit 2 in the third stage, hence a third stage strobe signal STB' is generated in the unit 2 in the third stage, and thereby the cell outputs of the second stage are written in the memory cells 4 in the third stage, In this way, by applying the CLR signal three times to the terminal 32 of the last stage buffer circuit unit 2, all the contents in the memory cells in the four stages are read through the data output terminals $D_{out1}$ to $D_{out4}$.

As described in detail above, according to the present invention, owing to the fact that FIFO buffer control circuit is composed of a plurality of unit circuits each having the same circuit construction and the respective unit circuits have a very simple structure, it is advantageous both with respect to an amount of circuit and with respect to a circuit construction, especially in a FIFO buffer consisting of a small number of stages. Moreover, since processing such as addition or subtraction is unnecessary, the control circuit is advantageous in respect to an operation speed as applied to a FIFO buffer having a small number of stages.

I claim:

1. A memory device comprising plural stages of memory units, each of said memory units having a data input terminal receiving a data signal from the preceding stage, a data output terminal and a control terminal receiving a control signal for controlling a write operation thereof, and plural stages of control units provided for the respective stages of said memory units, each of said control units operatively generating the control signal for the memory unit in the corresponding stage and including first means for generating a set signal when the memory unit in the corresponding stage holds effective data, second means for receiving a clear signal from the subsequent stage of the control unit, third means responsive to said clear signal for disenabling said first means, fourth means for receiving the set signal from the preceding stage of the control unit, fifth means for generating the control signal under the conditions that said set signal is not generated in said first means and the clear signal from the subsequent stage of the control unit is not present when the set signal from the preceding stage of the control unit is present, sixth means responsive to the control signal for enabling said first means so as to generate the set signal, and seventh means for generating the clear signal for the preceding stage in response to disappearance of said control signal.

2. The device according to claim 1, in which said first means includes a latch circuit having an input terminal receiving the set signal from the preceding stage, a strobe terminal receiving said control signal, a clear terminal receiving the clear signal from the subsequent stage and an output terminal from which the set signal is derived.

3. The device according to claim 1, in which said seventh means includes a flip-flop circuit which is set in response to said control signal and reset in response to absence of the set signal from the preceding stage, and gate means for producing logic product of the output of said flip-flop circuit and the absence of said control signal.

4. The device according to claim 1, in which said fifth means includes logic means for producing logic product of the absence of the set signal, the absence of the clear signal from the subsequent stage and the presence of the set signal from the preceding stage.

5. The device according to claim 1, in which each of said memory units includes a flip-flop circuit.

6. A memory device comprising a data input terminal, a data output terminal, a write terminal, a clear terminal, first to m-th (m being an integer of 2 or more) memory units connected in cascade between said data input terminal and said data output terminal, each of said memory units including an input terminal, an output terminal and a control terminal, means for connecting the input terminal of said first memory unit to said data input terminal, means for connecting the output terminal of said m-th memory unit to said data output terminal, and a control circuit coupled to said write terminal and said clear terminal for controlling shift operation for shifting data in direction from said first memory unit to said m-th memory unit, said control circuit including first to m-th control units each having first to fifth terminals, a latch circuit having an input terminal connected to said first terminal, an output terminal connected to said second terminal, a strobe terminal connected to said third terminal and a clear terminal connected to said fifth terminal, a first AND gate receiving an inverted signal of the signal at said second terminal, an inverted signal of the signal at said fifth terminal and a signal at said first signal and having an output terminal coupled to said third terminal and to said strobe terminal of said latch circuit, a flip-flop circuit having a set terminal coupled to the output terminal of said first AND gate and a reset terminal receiving an inverted signal of the signal at said first terminal and a second AND gate receiving an output signal of said flip-flop circuit and an inverted signal of the signal at the output terminal of said first AND gate and an output terminal coupled to said fourth terminal, first to m-th means for connecting the third terminals of said first to m-th control units to the control terminals of said first to m-th memory units, means for connecting the first terminal of said first control unit to said write terminal, means for connecting the fifth terminal of said m-th control unit to said clear terminal, the first terminal of n-th control unit (n being an integer of 2 to m) being connected to the second terminal of (n−1)-th control unit, the fourth terminal of said n-th control unit being connected to the fifth terminal of said (n−1)-th control unit.

7. A memory device comprising a plural stages of memory cells arranged in series in which data is inputted in a first stage memory cell and outputted from a final stage memory cell, a plural stages of control units provided in correspondence with the respective stages of said memory cells, each of said control units including latch means which takes a first state when effective data is held in the associated memory cell and takes a second state when effective data is not held therein, means for receiving an output signal of the latch means belonging to the previous stage, means for generating a control signal when said latch means takes said second state while the latch means of the previous stage takes said first state, and means for supplying the associated memory cell with said control signal thereby to allow the associated memory cell to take data therein from the previous stage memory cell.

* * * * *

UNITED STATES PATENT AND TRADEMARK OFFICE
CERTIFICATE OF CORRECTION

PATENT NO. : 4,459,681
DATED : July 10, 1984
INVENTOR(S) : Toshinori OHTSUKA

It is certified that error appears in the above-identified patent and that said Letters Patent is hereby corrected as shown below:

Page 1, item [73] Assignee, please delete "Nippon Electric Co., Ltd., Tokyo, Japan".

Signed and Sealed this

Seventh Day of May 1985

[SEAL]

Attest:

DONALD J. QUIGG

Attesting Officer    Acting Commissioner of Patents and Trademarks